United States Patent [19]

Nelson

[11] Patent Number: 4,720,633
[45] Date of Patent: Jan. 19, 1988

[54] SCANNING ELECTRON MICROSCOPE FOR VISUALIZATION OF WET SAMPLES

[75] Inventor: Alan C. Nelson, Andover, Mass.

[73] Assignee: Electro-Scan Corporation, Topsfield, Mass.

[21] Appl. No.: 820,537

[22] Filed: Jan. 17, 1986

[51] Int. Cl.[4] ............................................. G01N 23/00
[52] U.S. Cl. .................................... 250/310; 250/251
[58] Field of Search ............... 250/251, 306, 310, 311, 250/441.1; 319/121 EQ, 121 EJ, 121 EN

[56] References Cited

U.S. PATENT DOCUMENTS

| | | | |
|---|---|---|---|
| 2,467,224 | 4/1949 | Picard | 250/399 |
| 2,890,342 | 6/1959 | Columbe | 250/306 |
| 4,393,295 | 7/1983 | Beisswenger et al. | 319/121 EJ |
| 4,528,451 | 7/1985 | Petric et al. | 250/441.1 |
| 4,596,928 | 6/1986 | Dantilatos | 250/310 |

*Primary Examiner*—Bruce C. Anderson
*Attorney, Agent, or Firm*—John P. White; Michael Stark

[57] ABSTRACT

A scanning electron microscope useful for obtaining microscopic data or images of wet specimens is provided with comprises an electron source capable of emitting a beam of electrons; an electron optical vacuum column with means for focussing the beam of electrons; means for scanning the focussed beam of electrons across a specimen; a differentially pumped aperture column attached to the electron optical vacuum column and having at least two walls perpendicular to the sides of the differentially pumped aperture column defining a suitable series of pressure gradients, each wall having an aperture aligned to permit the beam of electrons to pass through said differentially pumped aperture column; a specimen chamber which may be maintained at normal atmospheric pressure; a specimen mount; means of preventing the buildup of negative charge on the surface of the specimen; and a detector and image recording system.

9 Claims, 1 Drawing Figure

SCANNING ELECTRON MICROSCOPE FOR VISUALIZATION OF WET SAMPLES

BACKGROUND OF THE INVENTION

The optical light microscope has played a most profound role in biological research by permitting the first view into the microscopic world of cells. One of the greatest applications of light microscopy is in the study of living microorganisms and tissues, since the light microscope can probe a sample in its somewhat natural condition. However, the light microscope is limited to a resolution of about one micron (1 micron = $10^{-4}$ cm), corresponding to a maximum usable magnification of 2000x. Progress in biology and medicine has demanded much higher magnifications and resolutions than those achievable with traditional light microscopes, and newer technologies in electron microscopy have been developed. A good scanning electron microscope can provide usable magnifications near 200,000x with a resolution in tens of Angstroms (1 A = $10^{-8}$ cm).

While optical light microscopes and electron microscopes have contributed to significant scientific discoveries in the past and large numbers of these instruments are currently in use, both devices are of limited usefulness and do not fully address the micro-imaging needs of contemporary research and industry. Optical light microscopes do not provide the magnification power and high resolution required for many industrial applications and current scientific research. Electron microscopes, while providing much higher resolution than traditional optical microscopes, are limited by their inability to image living and wet specimens or other specimens maintained under room conditions.

Alternative imaging technologies, such as computer-aided tomography ("CAT") and nuclear magnetic resonance ("NMR"), allow imaging or living specimens but lack the necessary magnification and high resolution features of electron microscopes.

Generally, electron microscopes operate by directing a beam of electrons rapidly over or through the surface of a specimen contained in an evacuated chamber. As the electrons hit the specimen, the specimen scatters the electrons. A device then reads the dispersion intensities and translates them into an image of the specimen. Obtaining an undistorted image of the specimen from the interaction of the electrons with the specimen requires that the electron beam hit the specimen directly without being scattered by air molecules. To avoid the distortion caused by air molecules, electron microscope specimens are placed in a vacuum chamber during the imaging process, thereby providing the electron beam with an unimpeded path to the specimen.

The vacuum chamber eliminates atmospheric distortion in the imaging process but makes it impossible to use the electron microscope to image living and wet specimens. Living specimens, such as cells and tissues, cannot survive in a vacuum for the time necessary to produce the image. Similarly, wet specimens experience evaporation of their fluid content in the vacuum before an image can be produced. Additionally, the electron beam causes a negative charge to build up on the surface of most specimens, resulting in lower image resolution. To overcome this problem, specimens are routinely coated with a thin layer of metal to permit them to conduct away the negative charge. These metal coatings usually harm wet and living specimens and further imped the electron micro-imaging of such substances. Consequently, microscopic examination of wet or living substances has generally been performed with traditional optical light microscopes which lack the needed magnification and resolution power of electron microscopes.

The problem of developing a high resolution imaging capability for living and wet substances or for surface morphology of materials has preoccupied the field of micro-imaging technology for some time. Attempts to solve the problem have led to the creation of such devices as acoustic microscopes, electron tunneling microscopes, heavy ion microscopes and x-ray microscopes. However, these devices are not capable of producing high resolution images without subjecting specimens to high vacuum or heavy radiation doses and usually both.

SUMMARY OF THE INVENTION

The present invention concerns a microscope useful for obtaining microscopic data and/or images of specimens wherein a beam of electrons emitted from an electron source is focused and maintained in a strong vacuum column while the specimen is held in a specimen chamber under conditions other than a strong vacuum, e.g. conditions similar to those in the specimen's natural environment. The focused beam of electrons passes from the vacuum column through a differentially pumped aperture column and into a specimen chamber where it is scanned across the surface of the specimen to be imaged.

The differentially pumped aperture column is comprised of a series of step pressure gradients separated by thin walls, each with a tiny aperture just small enough to permit the controlled movement of air molecules and aligned to allow the beam of electrons to pass through the differentially pumped aperture column and into the specimen chamber. A network of air pumps is used to create the vacuum gradient within the aperture column, wherein each wall having an aperture defines a pressure gradient of about two orders of magnitude. The aperture column has at least two apertures.

Inside the specimen chamber a specimen mount is positioned for supporting and/or moving a specimen so as to allow the focused beam of electrons to interact with the specimen. The mount is located only a few millimeters from the differentially pumped aperture column to reduce deflection or dispersion of the electrons by air molecules in the path of the focused beam of electrons. Furthermore, a charge neutralizer in the specimen chamber may be used to prevent the buildup of negative charge on the surface of the specimen caused by the electron beam as it interacts with the specimen.

In one embodiment of the invention the buildup of negative charge on the specimen surface is prevented by blowing air over the specimen surface. In a preferred embodiment of the invention an adjustable voltage aspirator causes charged air molecules to flow across the specimen surface. In a specific embodiment of the invention the charged air molecules which flow across the specimen surface are collected by a capacitor plate located adjacent to the specimen mount opposite the aspirator.

The invention uses a detector suitable for detecting a signal capable of being transmitted through the specimen and the environment of the specimen chamber. Examples of such signals are high energy backscatter electrons, characteristic x-rays, and photons, all of which are emitted upon exposure of the specimen to the focused beam of electrons. Detectors suitable for detecting these signals include scintillator detectors and semiconductor detectors. The detector provides an electrical signal output representative of the detected signal. This output is used to display and record the image represented by the detected signal.

One embodiment of the invention contemplates a scintillator detector disposed above the specimen mount and a charge neutralizer comprising an adjustable voltage aspirator. In another embodiment of the invention, the detector is a semiconductor disposed above the specimen mount and the charge neutralizer is an adjustable voltage aspirator. A further embodiment of the invention contemplates a semiconductor detector disposed above the specimen mount and a charge neutralizer comprising an adjustable voltage aspirator with a capacitor plate having a charge opposite that of the charged air molecules.

In a preferred embodiment of the invention, the differentially pumped aperture column has three apertures, the detector is a scintillator disposed above the specimen mount and the charge neutralizer is an adjustable voltage aspirator with a capacitor plate. Another preferred embodiment contemplates a differentially pumped aperture column with three apertures, a semiconductor detector disposed above the specimen mount and a charge neutralizer comprising an adjustable voltage aspirator with a capacitor plate.

This invention permits a specimen to be examined in an environment other than a vacuum and without preparation restrictions. It is therefore useful for microimaging living and wet substances or other materials at normal atmospheric conditions or other conditions. Applications for this device include biological and materials science research, medical-clinical diagnostics and surgery, oil exploration/drilling core structure analysis, semiconductor quality control, and industrial process control.

DETAILED DESCRIPTION OF THE INVENTION

Figure 1:
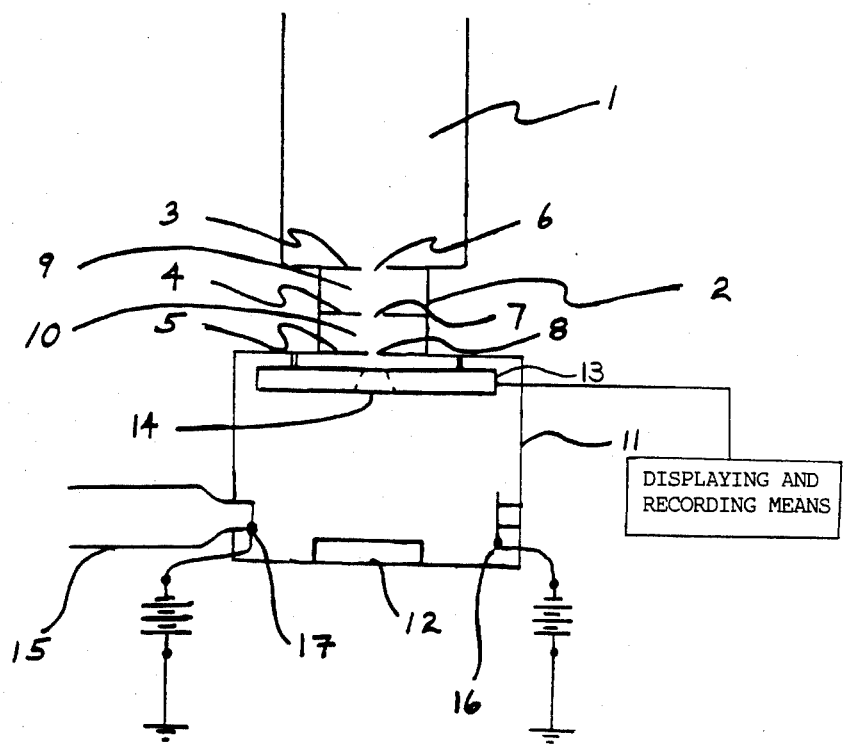
FIG. 1 is a schematic cross-sectioned view of a device embodying the present invention in a particular form.

Referring in more particularity to FIG. 1, the invention contemplates an electron optical vacuum column 1 with an electron source capable of emitting a beam of electrons. The strong vacuum within the column permits the beam of electrons to pass freely through the column without being deflected by collisions with air molecules. Also within the column are means for focusing the beam of electrons and scanning it across a sample.

The beam of electrons passes from the strong vacuum of the electron optical vacuum column 1 into a differentially pumped aperture column 2 attached to the electron optical vacuum column 1. The differentially pumped aperture column 2 comprises at least two end walls 3 and 5 perpendicularly depending from the sides of the column 2. Additionally, one or more interior walls 4 may be similarly disposed between said end walls 3 and 5. Each wall contains an aperture 6, 7 and 8 aligned to permit the passage of the beam of electrons through the differentially pumped aperture column.

The side walls of the differentially pumped aperture column 2 and the perpendicular walls 3, 4 and 5 define a series of air pressure gradients through which the beam of electrons passes from a zone of low pressure 9 to successive zones of higher pressure 10. This series of air pressure gradients is maintained by a network of air pumps and the air flow between adjacent zones of pressure is controlled by the diameter of the aperture connecting each zone.

By limiting the number of air molecules within the differentially pumped aperture column 2 and controlling the air flow between adjacent zones of pressure, the beam of electrons is permitted to pass through the differentially pumped aperture column without being significantly distorted by collisions with air molecules.

The present invention contemplates a device comprising at least two apertures. A device with a differentially pumped aperture column having two apertures provides an image resolution of about 0.2 microns. However, a device with a differentially pumped aperture column having three apertures offers improved vacuum stability resulting from the stabilized air movement between adjacent zones of pressure. Such a device may provide an image resolution of about 0.02 microns.

In a preferred embodiment of the invention, the beam of electrons passes from the electron optical vacuum column 1 wherein the air pressure is approximately $10^{-5}$ Torr, to a first zone of pressure 9 defined by the side walls of the differentially pumped aperture column 2, a first perpendicular wall 3 and a second perpendicular wall 4, said first zone of pressure 9 being connected to the electron optical vacuum column 1 by a first aperture, the objective aperture 6, and having a pressure of approximately $10^{-2}$ Torr. The beam of electrons passes from the first zone of pressure 9 to a second zone of pressure 10 defined by the side walls of the differentially pumped vacuum column 2, the second perpendicular wall 4 and a third perpendicular wall 5. Said second zone of pressure 10 is connected to the first zone of pressure 9 by a second aperture, internal aperture 7, and to the specimen chamber by a third aperture the pressure limiting aperture 8. A pressure of approximately 10 Torr is maintained within the second zone of pressure. This embodiment of the invention further contemplates the optical aperture 6 having a diameter of approximately 200 $\mu$m, the internal aperture 7 having a diameter of approximately 100 $\mu$m and the pressure limiting aperture 8 having a diameter of approximately 500 $\mu$m. The distance between the optical aperture 6 and the internal aperture 7 is approximately 1 mm and the distance between the internal aperture 7 and the pressure limiting aperture 8 is approximately 2 mm.

The beam of electrons passes through the pressure limiting aperture 8 of the differentially pumped aperture column 2 and into the specimen chamber 11. The specimen chamber 11 may be at normal atmospheric pressure or another suitable pressure under which the specimen to be imaged may be maintained.

Located within the specimen chamber is a specimen mount 12 on which the specimen to be imaged is supported. The specimen 12 may also be capable of physically moving the specimen during imaging.

Also located within the specimen chamber is a detector capable of detecting high energy electrons or x-rays and other signals emitted by the specimen upon exposure to the beam of electrons. Suitable detectors include scintillators, semiconductors, and photo multiplier tubes. In a preferred embodiment of the invention the detector comprises a semiconductor disc 13 disposed above the specimen mount 12, said disc having a hole 14 through which the beam of electrons passes. The surface of the disc facing the specimen mount is divided into a quadrant. The size of the semiconductor disc is dependent on the distance between the disc and the specimen to be imaged. For example, a 0.5 mm spacing between the disc and the specimen requires a disc having an approximate diameter of two centimeters. In a preferred embodiment of the invention the means for preventing the buildup of negative ions on the surface of the specimen includes an adjustable voltage aspirator 15 and a capacitor plate 16. Surface charge buildup is prevented by causing charged air molecules from the aspirator to flow across the surface of the specimen and carry away the specimen charge. The aspirator has a variable power grid 17 at its opening for charging air molecules. Said charged air molecules are capacitively collected by the charged capacitor plate 16.

What I claim is:

1. A device for obtaining microscopic data or images of specimens which comprises:
   a. an electron source for emitting a beam of electrons into an electron optical vacuum column;
   b. the electron optical vacuum column including means for focusing the beam of electrons and means for scanning the surface of a specimen with the focused beam of electrons;
   c. a differentially pumped aperture column attached to the electron optical vacuum column and having at least three walls perpendicular to the sides of the differentially pumped aperture column and defining a series of pressure gradients, each wall having an aperture aligned to permit the beam of electrons to pass through the differentially pumped aperture column;
   d. a specimen chamber for holding the specimen to be scanned with the focused beam of electrons and capable of being maintained at a pressure which may be different from that of the electron optical vacuum column and the differentially pumped aperture column and attached to the differentially pumped aperture column so as to allow the focused beam of electrons to enter into the specimen chamber;
   e. a specimen mount located within the specimen chamber and positioned for supporting the specimen to be scanned with the focused beam of electrons;
   f. means within the specimen chamber for preventing the buildup of negative charge on the surface of the specimen;
   g. a detector disposed wholly within the specimen chamber and positioned with respect to a specimen supported by the specimen mount so as to detect a signal emitted from the specimen upon the scanning of the specimen with the focused beam of electrons, the detector providing an electrical signal output representative of the signal detected thereby; and
   h. means for displaying and recording the information provided by the output from the detector.

2. A device as defined in claim 1, wherein the specimen mount is capable of moving a specimen.

3. A device as claimed in claim 1, wherein the means for preventing the buildup of negative charge on the surface of a specimen comprises an adjustable voltage aspirator disposed adjacent to the specimen mount which causes charged air molecules to flow across the surface of the specimen.

4. A device as defined in claim 1, wherein the means for preventing the buildup of negative charge on the surface of a specimen comprises an adjustable voltage aspirator disposed adjacent to the specimen mount which causes charged air molecules to flow across the surface of the specimen and a capacitor plate disposed adjacent to the specimen mount on the side opposite the aspirator with a charge opposite that of the charged air molecules.

5. A device as defined in claim 1, wherein the detector is a scintillator disposed above the specimen mount.

6. A device as defined in claim 3, wherein the detector is a scintillator disposed above the specimen mount.

7. A device as defined in claim 3, wherein the detector is a semiconductor disposed above the specimen mount.

8. A device as defined in claim 4, wherein the detector is a semiconductor disposed above the specimen mount.

9. A device as defined in claim 8, wherein the detector is a semiconductor disposed above the specimen mount.

* * * * *